United States Patent
Zhang et al.

(10) Patent No.: US 12,058,846 B2
(45) Date of Patent: Aug. 6, 2024

(54) PREPARATION AND APPLICATION IN WAVE ABSORPTION OF TITANIUM SULFIDE NANOMATERIAL AND COMPOSITE MATERIAL THEREOF

(71) Applicant: Chongqing University, Chongqing (CN)

(72) Inventors: Yuxin Zhang, Chongqing (CN); Kailin Li, Chongqing (CN); Ping'an Yang, Chongqing (CN); Xiaoying Liu, Chongqing (CN); Shihai Ren, Chongqing (CN); Shuang Yi, Chongqing (CN); Jinsong Rao, Chongqing (CN); Nan Li, Chongqing (CN); Lichao Dong, Chongqing (CN); Dalong Cong, Chongqing (CN); Jingying Bai, Chongqing (CN); Wenxiang Shu, Chongqing (CN)

(73) Assignee: CHONGQING UNIVERSITY (CN)

( * ) Notice: Subject to any disclaimer, the term of this patent is extended or adjusted under 35 U.S.C. 154(b) by 157 days.

(21) Appl. No.: 17/652,276

(22) Filed: Feb. 23, 2022

(65) Prior Publication Data
US 2023/0063025 A1 Mar. 2, 2023

(30) Foreign Application Priority Data

Sep. 2, 2021 (CN) .......................... 202111024874.7
Sep. 23, 2021 (CN) .......................... 202111116673.X

(51) Int. Cl.
 $C01G\ 23/00$ (2006.01)
 $C09C\ 1/36$ (2006.01)
 $C09C\ 3/06$ (2006.01)
 $H05K\ 9/00$ (2006.01)

(52) U.S. Cl.
CPC ......... H05K 9/0083 (2013.01); C01G 23/007 (2013.01); C09C 1/36 (2013.01); C09C 3/063 (2013.01); $C01P\ 2002/72$ (2013.01); $C01P\ 2002/85$ (2013.01); $C01P\ 2004/03$ (2013.01); $C01P\ 2004/04$ (2013.01); $C01P\ 2004/24$ (2013.01); $C01P\ 2004/61$ (2013.01)

(58) Field of Classification Search
None
See application file for complete search history.

(56) References Cited

U.S. PATENT DOCUMENTS

2019/0039028 A1* 2/2019 Wanunu et al. ...... C01B 19/007

FOREIGN PATENT DOCUMENTS

CN 102059082 A * 5/2011

OTHER PUBLICATIONS

Tang et al. Advanced batteries based on manganese dioxide and its composites. Energy Storage Materials, 12, 284-309 (Year: 2018).*

* cited by examiner

*Primary Examiner* — Tanisha Diggs

(57) ABSTRACT

A titanium sulfide (TiS) nanomaterial and a composite material thereof for wave absorption are disclosed. The TiS nanomaterial is in a form of dispersed micro-particles which are bulks formed by stacking two-dimensional nano-sheets. The TiS nanomaterial is a bulk formed by stacking two-dimensional nano-sheets, thereby having a laminated structure that improves the wave absorption effect. In addition, experimental results demonstrate that the TiS nanomaterial with a dose of 40 wt % has the most excellent wave absorption performance, with a minimum reflection loss up to −47.4 dB, an effective absorption bandwidth of 5.9 GHz and an absorption peak frequency of 6.8 GHz, which are superior to those of existing two-dimensional bulk materials. One of reasons for the excellent wave absorption performance of the TiS nanomaterial may be because the laminated micro-morphology of TiS results in the electromagnetic wave refraction loss.

8 Claims, 20 Drawing Sheets

PREPARATION AND APPLICATION IN WAVE ABSORPTION OF TITANIUM SULFIDE NANOMATERIAL AND COMPOSITE MATERIAL THEREOF

CROSS REFERENCE TO THE RELATED APPLICATIONS

This application is based upon and claims priority to Chinese Patent Application No. 202111024874.7, filed on Sep. 2, 2021, and Chinese Patent Application No. 202111116673.X, filed on Sep. 23, 2021, the entire contents of which are incorporated herein by reference.

TECHNICAL FIELD

The present invention belongs to the technical field of wave-absorbing materials, and in particular to the preparation and an application in wave absorption of a titanium sulfide nanomaterial and a composite material thereof.

BACKGROUND

Since the $21^{st}$ century, the rapid development of science and technology, especially electronic information technology, has brought great convenience to our life and work. However, the excessive use of electronic products may lead to serious electromagnetic radiation and interference. Electromagnetic waves widely applied in science and technology also have caused a series of social problems. They affect communication and directly or indirectly damage human health, thereby becoming a new highly-hazardous and difficult-to-prevent pollution source following water, air and noise. Electromagnetic waves generated by household appliances are tremendously harmful to human tissue and cells. If pregnant women use microwave ovens for a long term, the probability of fetal malformation will significantly increase, and the incidence of cancer in children after birth will increase. If women use electric blankets for a long time while sleeping, their menstrual cycles will obviously change. The number of children dying from leukemia in areas with severe electromagnetic pollution is more than double that in other areas. What's more, excessive electromagnetic radiation damages human health and affects the natural environment in which human beings live. For example, severe electromagnetic pollution affects plants to different degrees, resulting in their abnormal growth, genovariations, and even death. Similarly, electromagnetic radiation has adverse effects on livestock and wild animals. In addition, electromagnetic wave radiation greatly interferes with precision instruments.

In the field of military technology, with the rapid progress in information technology, countries are scrambling to develop in the direction of modern, information-based and high-tech military aspects while facing increasingly fierce competition. The world's military powers have been improving their detection, tracking and precise strike performance, accompanied by the emergence of various advanced photoelectromagnetic detection systems in succession. Such a situation will lead to the serious threat and challenge of "being discovered is equal to being hit and destroyed" for various weapon combat platforms and military targets on future battlefields. The stealth technology refers to a comprehensive technology that weakens detectable signals of targets, reduces identification and tracking capabilities of the enemy's detection equipment, and shortens the enemy's effective discovery distance. Under the background of high-grade, high-precision, advanced military technology, the modern military stealth technology has become an integrated penetration technology for the army, navy, and air force, playing a decisive role in modern warfare. The application of the stealth technology can dramatically improve the survivability of military systems as well as penetration and deep strike capabilities. The first-generation stealth aircraft F-117A "NightHawk", second-generation B-2 stealth bomber and Chinese J-20 stealth fighter have emerged successively. Stealth fighters have super-strong attack and combat capabilities with a very small number of sorties. The stealth technology has constantly shocked people due to its huge, undoubtedly becoming a research hotspot of the world's military powers in the field of military technology.

The research and application of wave-absorbing materials has a great influence on the development of civil undertakings in electromagnetic radiation prevention and military stealth. Absorbents with good wave absorption properties are the core of wave-absorbing materials. In order to meet requirements for properties such as thinness, lightness, wideness and strong performance, the research of absorbents is developing in the direction of efficient, composite, compatible and intelligent products. At present, absorbents under key research and application at home and abroad are mainly concentrated in the following aspects: carbon materials, ferrites, ceramic materials, nanomaterials, chiral materials, conductive polymers, etc. Carbon materials and their derivatives as wave-absorbing materials have poor electromagnetic wave loss performance due to an excessively high dielectric constant resulting in an air impedance mismatch. Although ferrites as wave-absorbing materials have the advantages of excellent absorption performance and low cost, their scope of application is limited due to high density, poor high temperature performance, narrow absorption frequency band and other disadvantages. Ceramic materials are featured by excellent high corrosion resistance, electrical insulation and excellent thermal stability, exhibiting excellent mechanical properties, and thereby can be used in some severe conditions, but they need to be prepared under high temperature conditions and harsh reaction conditions. There are still some problems in the research and application of conductive polymers. Conductive polymers contain a large amount of fillers, most of which have a narrow effective wave absorption band, and doped conductive polymers are difficult to process with poor structural uniformity, which also limits the practical application of conductive polymers to some extent. Compared with ordinary wave-absorbing materials, chiral wave-absorbing materials have two advantages. First, the adjustment of chiral parameters is easier than that of the dielectric constant and permeability. Second, the frequency sensitivity of chiral materials is lower than that of the dielectric constant and permeability, thereby facilitating broadband absorption, but the wave absorption mechanism of such materials is not very clear.

As a result, all kinds of mentioned materials have shortcomings. Either single-component materials or multi-component composite materials have great differences in an influence on electromagnetic wave absorption performance. For an application in wave absorption, in factors influencing the performance, materials have a very important position and role. Two-dimensional materials have been widely introduced into electromagnetic wave absorbing or shielding materials. Two-dimensional nanomaterials, such as graphene and laminated transition metal sulfide nano-sheets, are mainly based on the dielectric loss caused by their polymorphism, high specific surface area and good electron mobility. Furthermore, materials with two-dimensional laminated structures are quite different from their bulk materials in dielectric properties.

For example, r-GO exhibits stronger wave absorption than original graphite, because its higher specific surface area and excellent dielectric properties resulting from residual defects and functional groups greatly facilitate entry of electromagnetic waves into the material and attenuate absorption. Therefore, two-dimensional graphene-based composite materials have been widely studied as electromagnetic wave absorbents. However, due to the n-n interaction, graphene sheets often lead to a large number of agglomerations and uneven dispersion, thereby reducing the electromagnetic wave absorption intensity. In addition, compared with monolithic $MoS_2$, laminated $MoS_2$ nano-sheets obtained through top-down peeling are significantly enhanced in dielectric properties and wave absorption properties mainly due to their defect dipole polarization effect. When paraffin was doped with 60 wt % of fillers, having a coating thickness of 2.4 mm, the optimal reflection loss of $MoS_2$ nano-sheets is −38.42 dB.

It can be seen that for nanomaterials of all two-dimensional materials, the basic wave absorption performance of bulk materials is actually not high. Bulk materials have a small specific surface area, low structure utilization and poor intrinsic wave absorption performance due to their structural characteristics.

SUMMARY

The present invention discloses a higher-performance wave-absorbing bulk material that can not only improve basic performance values of a material, but also greatly improve the performance after further modified, which is of great significance.

The first aspect of the present invention provides a titanium sulfide nanomaterial, wherein titanium sulfide is in a form of dispersed micro-particles, and micro-particles are bulks formed by stacking two-dimensional nano-sheets.

Preferably, the size of a single micro-particle of the titanium sulfide nanomaterial is 25-100 microns, the thickness of two-dimensional nano-sheets is 5-10 nm, and bulks are irregular in shape.

The second aspect of the present invention provides a method for preparing the titanium sulfide nanomaterial, including the following steps: adding $TiF_4$, $(COOH)_2 \cdot 2H_2O$ and $CH_4N_2S$ to water in turn, and stirring the solution for 5-20 min; heating the mixed solution at 180-220° C. for 24-48 h, and naturally cooling it to room temperature; after a reaction, collecting, centrifuging and washing the reaction product to obtain a black solid, and drying the substance to obtain the TiS nanomaterial;

A molar ratio of Ti ions and S ions is 1:40.

A molar ratio of $TiF_4$, $(COOH)_2 \cdot 2H_2O$ and $CH_4N_2S$ is 1:13.5:40.

In the present invention, the product is controlled to be titanium sulfide instead of titanium disulfide by controlling the reaction temperature and time.

$(COOH)_2 \cdot 2H_2O$ plays a role in creating an acidic environment to avoid the formation of titanium hydroxides.

The third aspect of the present invention provides an application of titanium sulfide of the first aspect in a wave-absorbing material.

The fourth aspect of the present invention provides a wave-absorbing material containing titanium sulfide of the first aspect.

The fifth aspect of the present invention provides a $MnO_2$@TiS composite nanomaterial (manganese dioxide modified titanium sulfide composite nanomaterial), wherein the $MnO_2$@TiS composite nanomaterial is in a form of dispersed micro-particles, and micro-particles are bulks formed by stacking two-dimensional nano-sheets.

Preferably, the size of a single micro-particle of the $MnO_2$@TiS composite nanomaterial is 25-100 microns, the thickness of two-dimensional nano-sheets is 10-20 nm, and bulks are irregular in shape.

The sixth aspect of the present invention provides a method for preparing the $MnO_2$@TiS composite nanomaterial, including the following steps: adding the titanium sulfide nanomaterial of the first aspect to a reactor, adding a potassium permanganate solution to a liner of the reactor, tightening the reactor, heating it at 120-160° C. for 12-24 h, and naturally cooling it to room temperature; after a reaction, collecting, washing and centrifuging the product at the bottom of the reactor to obtain a black solid, and drying the substance to obtain the $MnO_2$@TiS nanomaterial.

A molar ratio of titanium sulfide and potassium permanganate is 1:20.

The seventh aspect of the present invention provides an application of the $MnO_2$@TiS composite nanomaterial of the fifth aspect in a wave-absorbing material.

The eighth aspect of the present invention provides a wave-absorbing material containing the $MnO_2$@TiS composite nanomaterial of the fifth aspect.

It can be seen from the above-mentioned technical problems that no matter how the bulk material of each material is modified, the performance can basically be satisfactorily improved. Nevertheless, in fact, if it is possible to improve the performance of the bulk material prior to modifications, the performance of composite materials can be greatly improved under the same supporting, laying a solid foundation for follow-up modification research work. Morphology-based studies have found that magnetic materials with laminated structures can break the Snooker limit. Compared with other morphologies (sphere and needle shapes), a laminated shape is optimal for electromagnetic wave absorbents. A laminated wave absorbent can generate a larger dipole moment due to its larger surface, which increases its absorption and scattering cross-section, and has a higher tangent angle of magnetic loss and a higher anisotropic equivalent field, thereby having favorable wave absorption performance.

Compared with the prior art, the present invention has the following beneficial effects:

1. The present invention discloses a TiS nanomaterial. The TiS nanomaterial is a bulk formed by stacking two-dimensional nano-sheets, thereby having a laminated structure that improves the wave absorption effect. In addition, experimental results demonstrate that the TiS nanomaterial with a dose of 40 wt % has the most excellent wave absorption performance, with a minimum reflection loss up to −47.4 dB (superior to −38.42 dB of the $MoS_2$ nano-sheet), an effective absorption bandwidth of 5.9 GHz and an absorption peak frequency of 6.8 GHz, which are superior to those of existing two-dimensional bulk materials. One of reasons for the excellent wave absorption performance of the TiS nanomaterial may be the laminated micro-morphology of TiS resulting in the electromagnetic wave refraction loss.

2. The present invention further discloses a $MnO_2$@TiS composite nanomaterial as a result of a modification to the TiS nanomaterial. The $MnO_2$@TiS composite nanomaterial is also a bulk formed by stacking two-dimensional nano-sheets, thereby having a laminated structure that improves the wave absorption effect. Moreover, wave absorption performance data shows that $MnO_2$@TiS/paraffin composite wave-absorbing materials with doses of 20 wt %, 40 wt % and 60 wt % have minimum reflection losses up to −65.12 dB, −102.68 dB and −104.54 dB, and effective absorption bandwidths up to 2.4 GHz, 5.44 GHz and 6.96 GHz, respectively, which are superior to those of existing two-dimensional bulk materials. In these results, the optimal properties are also superior to those of the TiS nanomaterial. The reason for superior absorbing properties of the $MnO_2$@TiS composite nanomaterial may be the synergistic wave absorption effect of manganese dioxide nano-sheets and two-dimensional laminated titanium sulfide materials.

3. The TiS nanomaterial and the $MnO_2$@TiS composite nanomaterial thereof of the present invention have excellent wave absorption performance when used as bulk materials of wave absorbents, and can be applied in the development of equipment products for electromagnetic shielding, electromagnetic wave absorption, etc.

DETAILED DESCRIPTION OF THE PREFERRED EMBODIMENTS

The present invention will be further described below through examples, but is not limited to these examples. Experimental methods without specific conditions indicated in the examples usually conform to conventional conditions and conditions described in manuals, or conditions recommended by manufacturers. Unless otherwise stated, all used general equipment, materials, reagents, etc. can be acquired from commercial sources. All required raw materials in the following examples and comparative examples are commercially available.

Example 1

A method for preparing a titanium sulfide nanomaterial, and in particular preparing a TiS nanomaterial by a one-step hydrothermal method, includes the following steps:

0.5 mmol of $TiF_4$, 6.75 mmol of $(COOH)_2 \cdot 2H_2O$ and 20 mmol of $CH_4N_2S$ were added to 60 mL of deionized water in turn, and magnetically stirred for 10 min; the mixed solution was transferred to a polytetrafluoroethylene (PTFE) reactor, heated at 220° C. for 48 h, and naturally cooled to room temperature; after the reaction mixture is cooled, the supernatant was poured out, the product at the bottom of the reactor was collected, washed with absolute ethanol and centrifuged at 5,000 rpm for 10 min to obtain a black solid, and this process was repeated 3 times; the resulting sample was vacuum-dried at 60° C. for 24 h to prepare the TiS nanomaterial.

Figure 1:
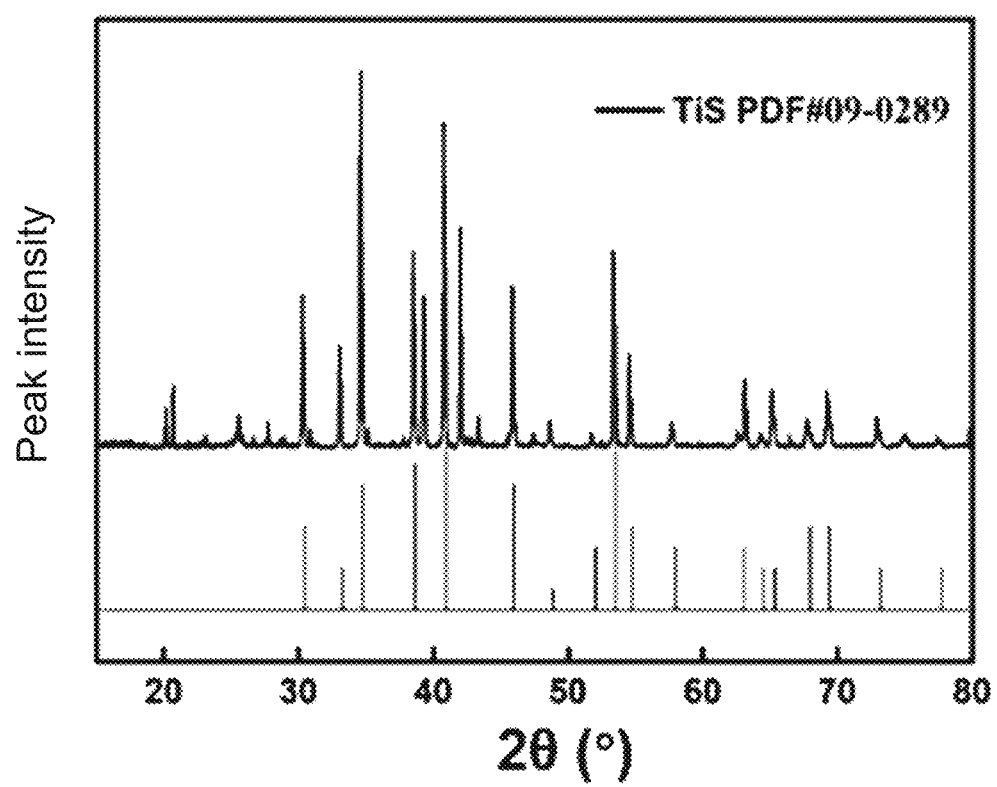
FIG. 1 shows an XRD spectrum of a two-dimensional TiS nanomaterial prepared in example 1.

The material was characterized. FIG. 1 is an XRD spectrum of a two-dimensional TiS nanomaterial prepared in example 1, reflecting the crystal structure and chemical composition of the composite material. FIG. 1 proves that a TiS intrinsic crystal material is successfully synthesized in example 1.

Figure 2:
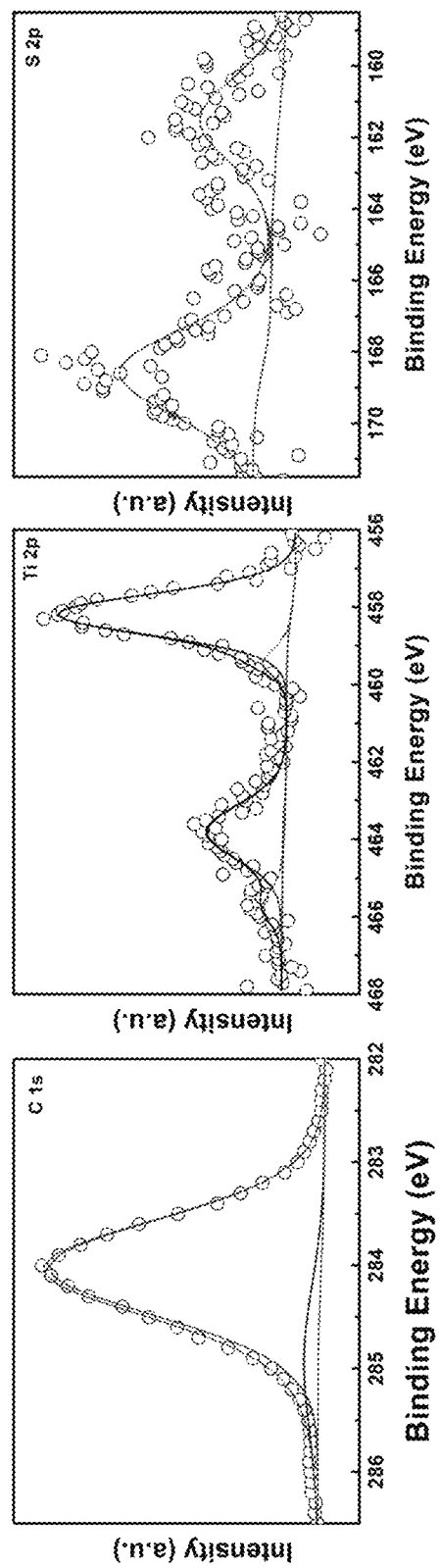
FIG. 2 shows XPS spectra of a two-dimensional TiS nanomaterial prepared in example 1.

FIG. 2 shows XPS spectra of a two-dimensional TiS nanomaterial prepared in example 1, reflecting the chemical composition and chemical valence state of the composite material. FIG. 2 proves that the nanomaterial is chemically composed of TiS, i.e., S has a valence of −2 and Ti has a valence of +2.

Figure 3:
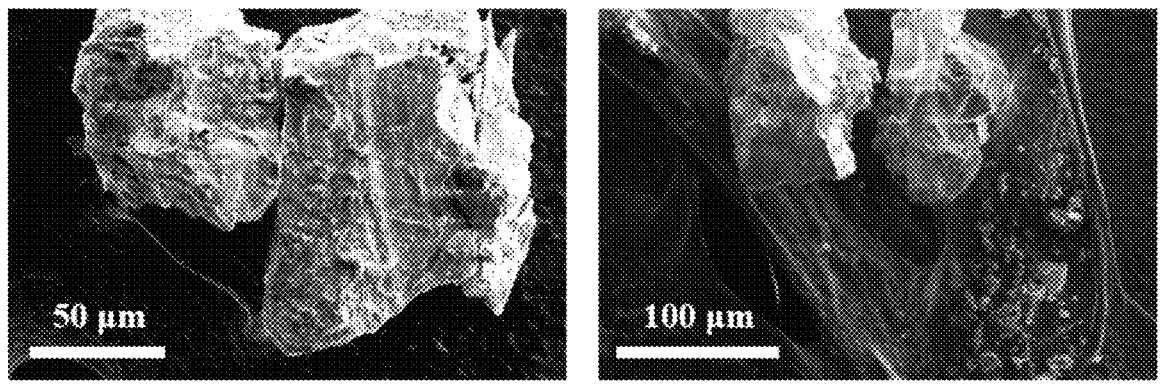
FIG. 3 is an SEM image of a two-dimensional TiS nanomaterial prepared in example 1.
Figure 4:
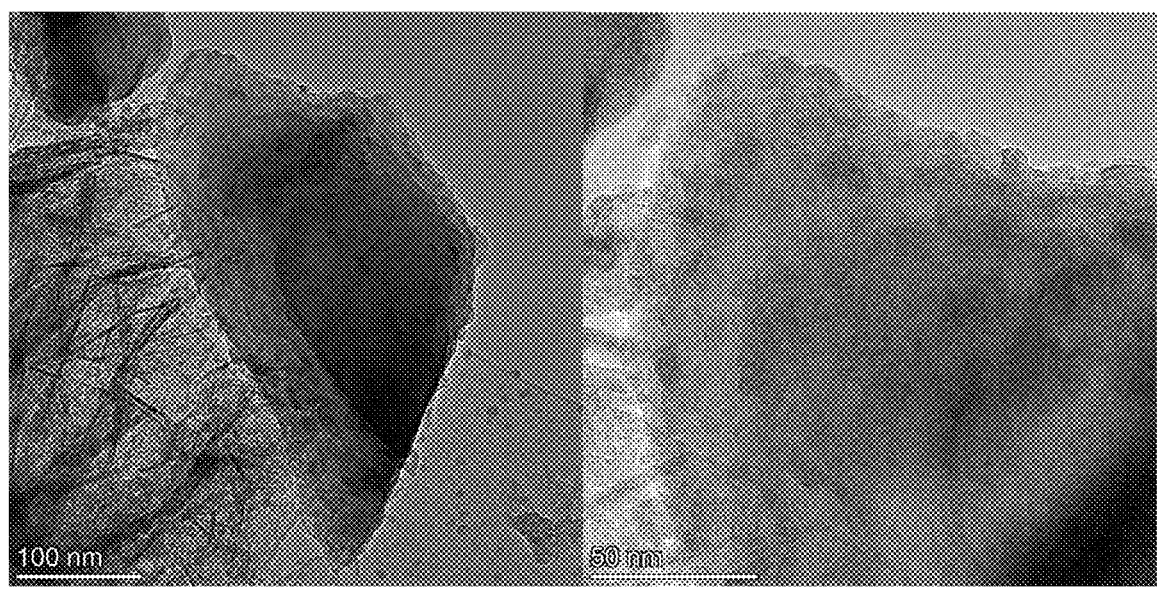
FIG. 4 is a TEM image of a two-dimensional TiS nanomaterial prepared in example 1.

FIG. 3 is an SEM image of a two-dimensional TiS nanomaterial prepared in example 1. FIG. 4 is a TEM image of a two-dimensional TiS nanomaterial prepared in example 1. FIGS. 3 and 4 reflect that the composite material is a bulk formed by stacking two-dimensional nano-sheets. Two-dimensional nano-sheets are 1-5 μm in size, 5-10 nm in thickness and 25-100 μm in bulk size.

Application Example 1

I. Preparation of a Wave-Absorbing Material Containing Titanium Sulfide of Example 1:

Titanium sulfide of example 1 was used as a wave absorbent. A test sample was prepared with the ultrasonically washed and dispersed clean wave absorbent and paraffin as raw materials. A paraffin section was crushed into small particles. Certain amounts of the clean wave absorbent and crushed paraffin were weighed in proportion, ground uniformly, put in a vacuum drying oven for heating and melting, stirred evenly, and poured into a special mold for pressing into coaxial rings as TiS/paraffin composite wave-absorbing material samples with an inner diameter of 3.04 mm, an outer diameter of 7.00 mm and an overall thickness of 3.04 mm. In TiS/paraffin composite wave-absorbing material samples, doses of TiS were 20 wt %, 40 wt % and 60 wt %. TiS/paraffin composite wave-absorbing material samples No. 1, No. 2 and No. 3 were obtained. The wt % was based on the total mass of TiS/paraffin composite wave-absorbing material samples.

II. Wave Absorption Performance Test of TiS/Paraffin Composite Wave-Absorbing Material by Coaxial Method:

The relative complex dielectric constant and relative complex permeability of a TiS/paraffin composite absorbing material within the frequency range of 2-18 GHz were measured by a coaxial method with a vector network analyzer (PNA-L, N5234A, Agilent).

The vector network analyzer was used to test the law of an influence of the dose of a TiS wave absorbent in a TiS nanomaterial on electromagnetic parameters, attenuation characteristics, impedance matching characteristics and wave absorption performance of a TiS/paraffin composite material.

Figure 5A:
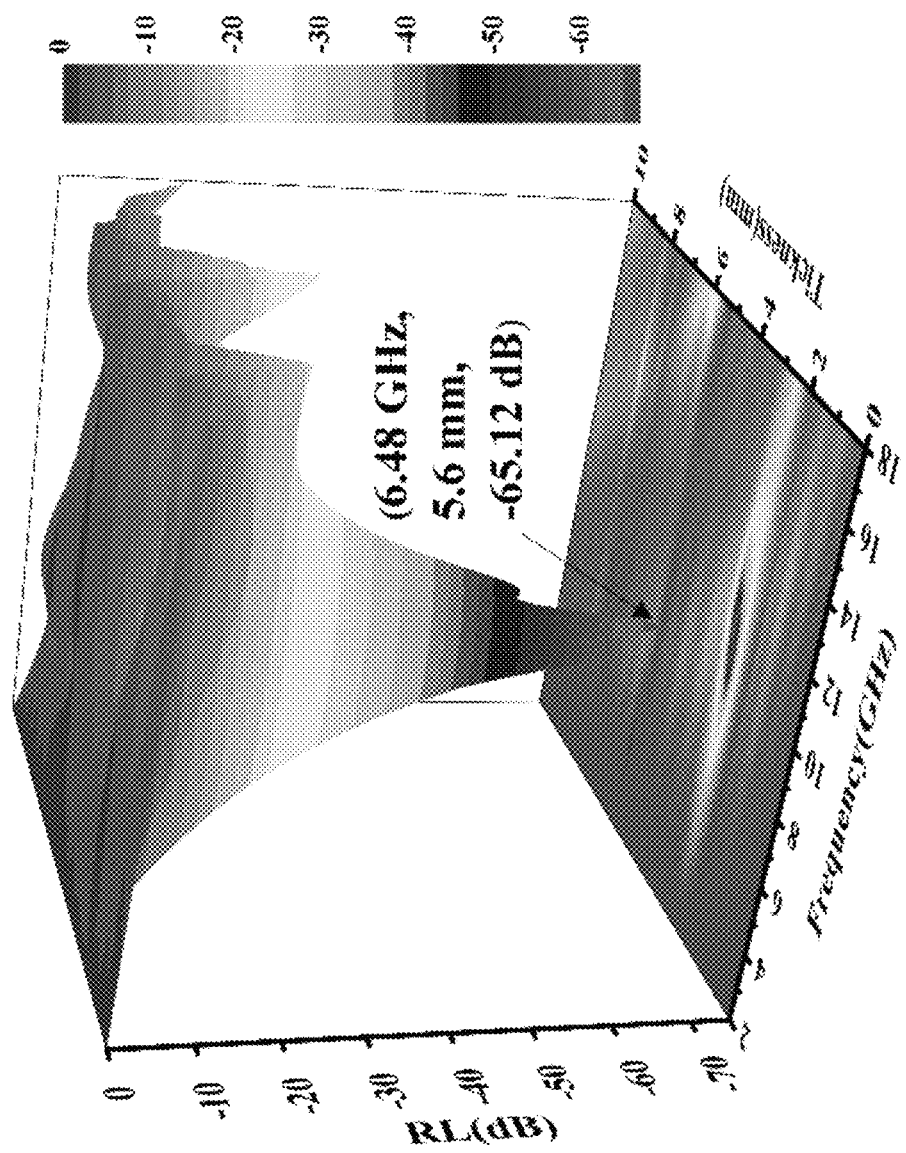
FIG. 5A shows the three-dimensional representation and FIG. 5B shows the contour plot of reflection losses of TiS/paraffin composite wave-absorbing material sample No. 1 in application example 1.
Figure 5B:
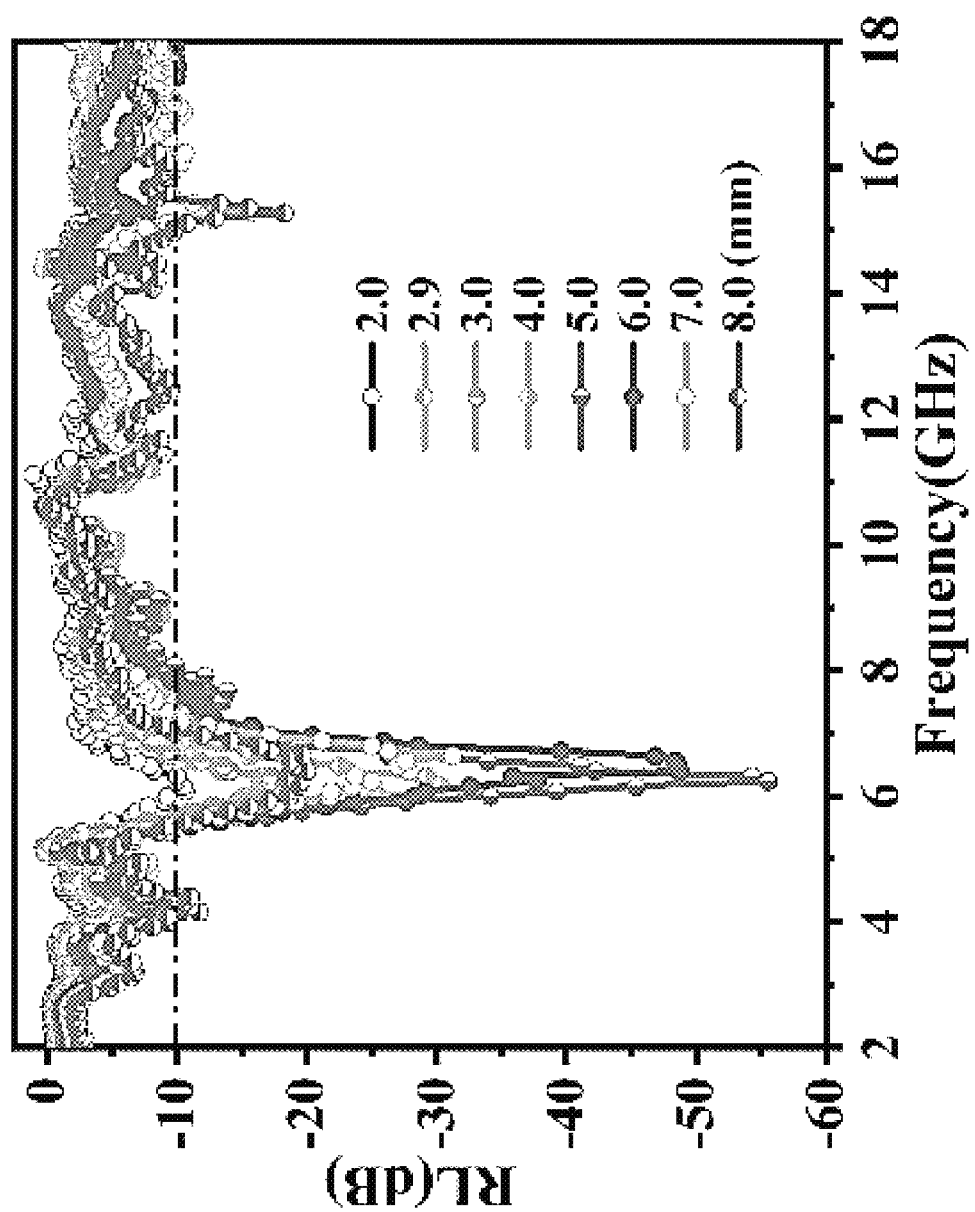
Figure 5C:
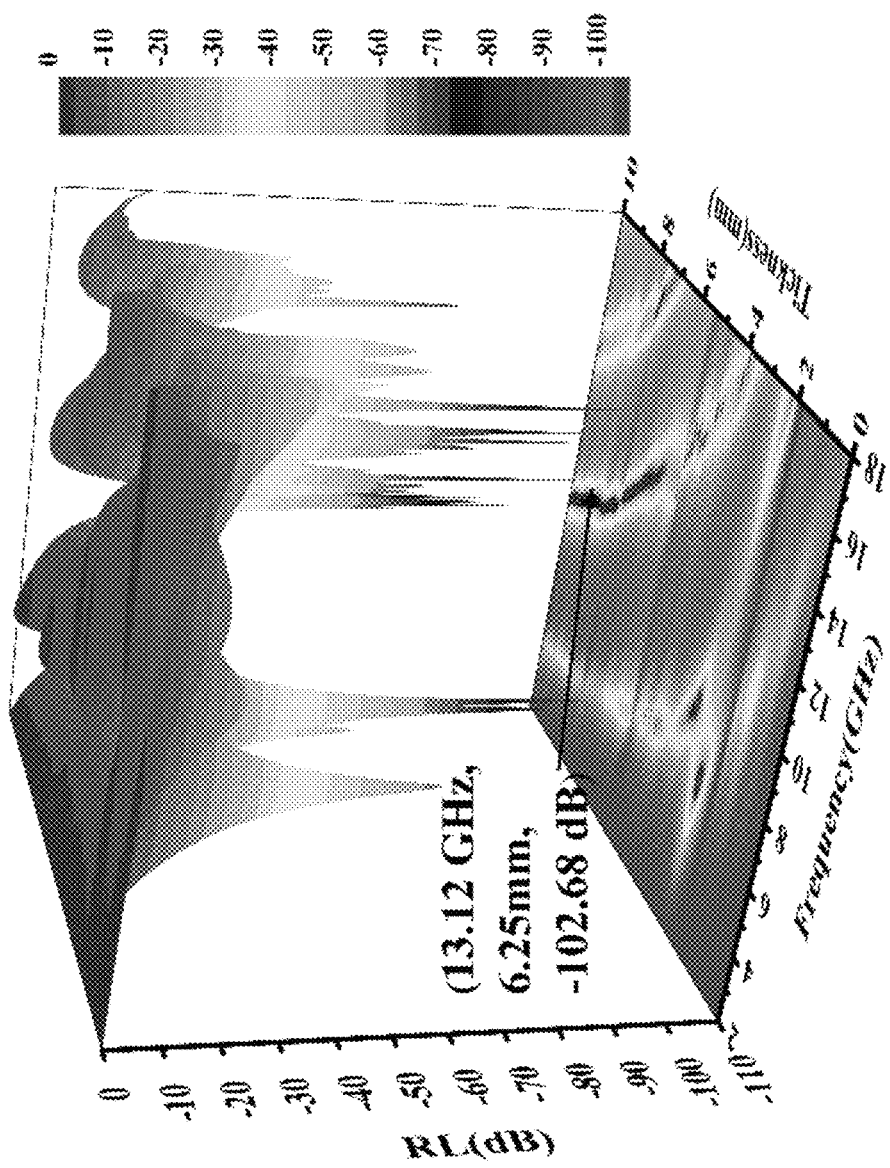
FIG. 5C shows the three-dimensional representation and FIG. 5D shows the contour plot of reflection losses of TiS/paraffin composite wave-absorbing material sample No. 2 in application example 1.
Figure 5D:
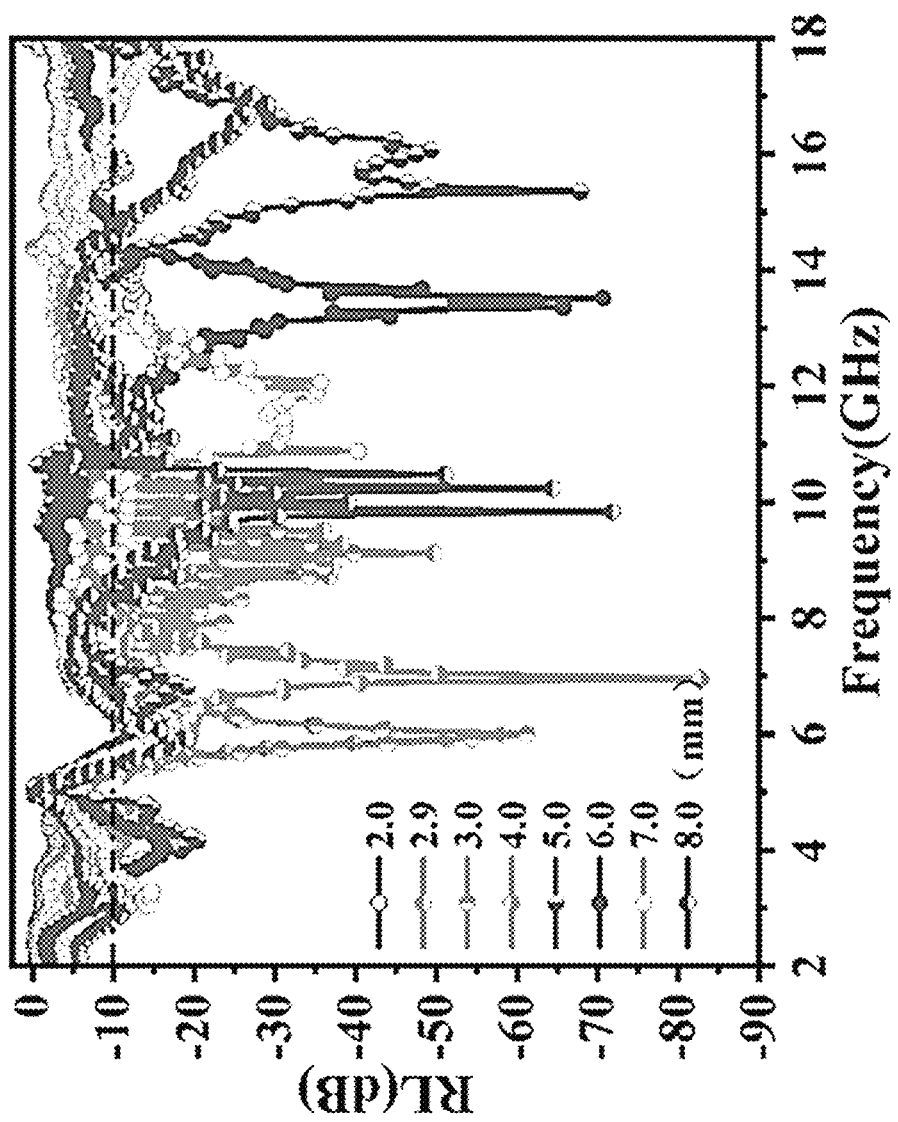
Figure 5E:
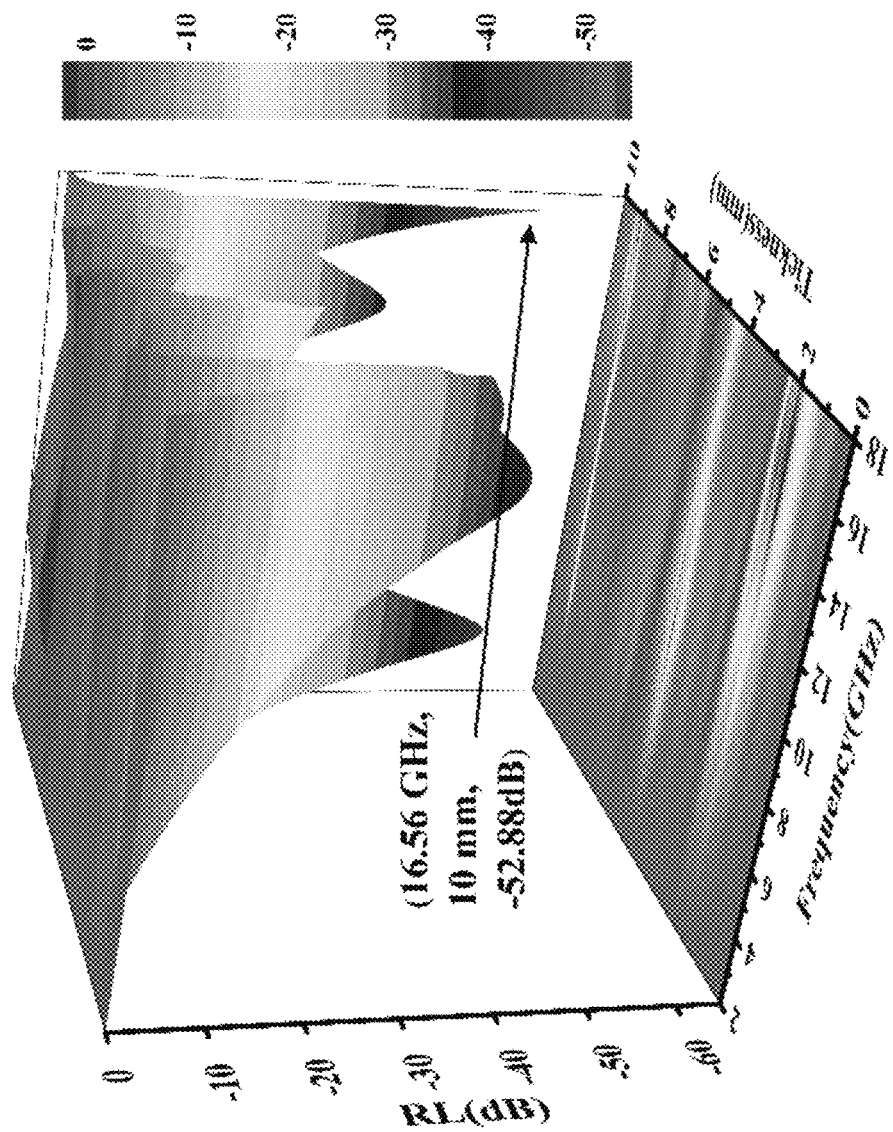
FIG. 5E shows the three-dimensional representation and FIG. 5F shows the contour plot of reflection losses of TiS/paraffin composite wave-absorbing material sample No. 3 in application example 1.
Figure 5F:
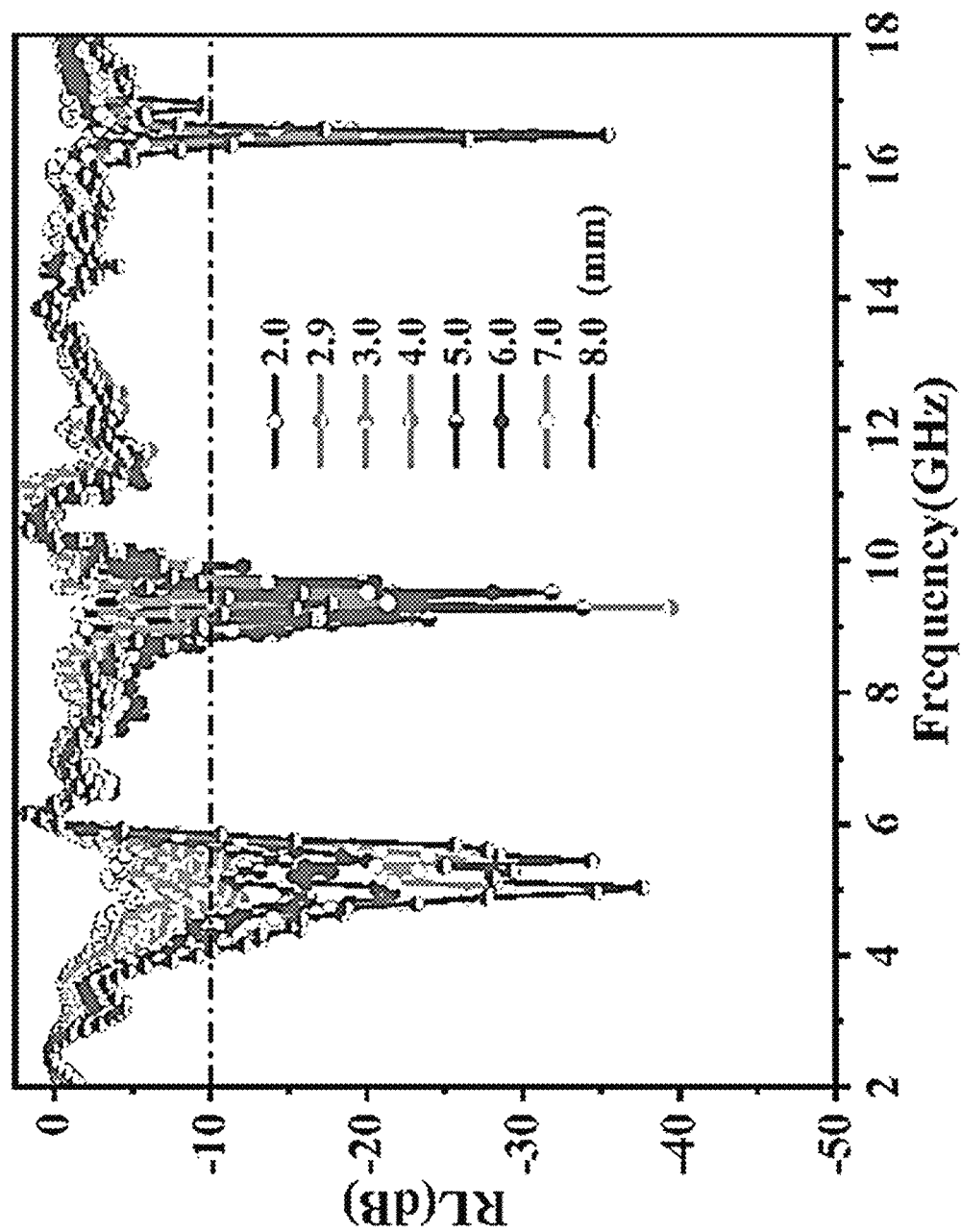

FIGS. 5A-5F reflect the wave absorption performance of the composite material. FIGS. 5A, 5C, 5E are respectively three-dimensional representations of reflection losses of TiS/paraffin composite wave-absorbing material samples No. 1, No. 2, and No. 3 in application example 1. FIGS. 5B, 5D, 5F are respectively contour plots of reflection losses of TiS/paraffin composite wave-absorbing material samples No. 1, No. 2, and No. 3 in application example 1. Experimental results demonstrate that the TiS nanomaterial with a dose of 40 wt/o has the most excellent wave absorption performance, with a minimum reflection loss up to −47.4 dB (superior to −38.42 dB of the $MoS_2$ nano-sheet), an effective absorption bandwidth of 5.9 GHz and an absorption peak frequency of 6.8 GHz, which are superior to those of existing two-dimensional bulk materials.

Example 2

A TiS intrinsic material was used as a template for supporting and modifications of a material by modifying a TiS nanomaterial. Example 2 provides a method for preparing a $MnO_2$@TiS composite nanomaterial, and in particular preparing a $MnO_2$@TiS composite nanomaterial by a secondary hydrothermal method:

100 mg of the TiS powder material prepared in example 1 was added to a 100 mL reactor liner, a 0.05 mol/L potassium permanganate solution was prepared, 70 mL of the 0.05 mol/L potassium permanganate solution was added to a liner of the reactor, and the reactor was tightened, heated in an oven at 160° C. for 24 h, and naturally cooled to room temperature; after a reaction, the supernatant was poured out, the product at the bottom of the reactor was collected, washed with absolute ethanol and centrifuged at 5,000 rpm for 10 min to obtain a black solid, and this process was repeated 3 times; the resulting sample was vacuum-dried at 60° C. for 24 h to prepare a $MnO_2$@TiS heterojunction nanomaterial.

Experimental results demonstrate that the prepared TiS nanomaterial has a two-dimensional laminated nano-sheet stacking structure.

The material was characterized.

Figure 6:
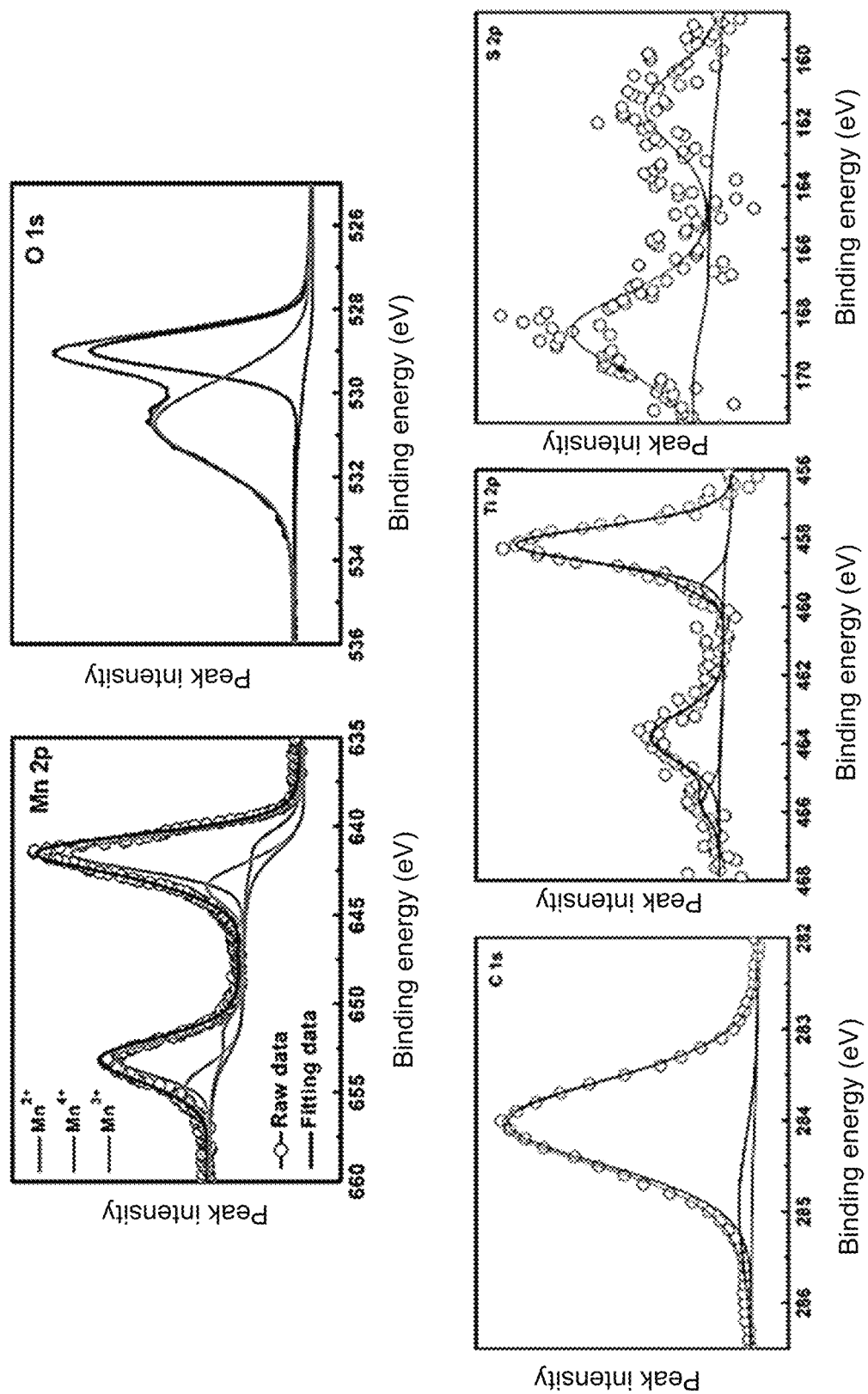
FIG. 6 shows XPS spectra of a $MnO_2$@TiS heterojunction nanomaterial prepared in example 2.

FIG. 6 shows XPS spectra of a $MnO_2$@TiS heterojunction nanomaterial prepared in example 2, reflecting that the composite material is chemically composed of $MnO_2$ and TiS, $MnO_2$ is supported on TiS, Mn has valences of +2, +3 and +4, O has a valence of −2, Ti has a valence of +2, and S has a valence of −2.

Figure 7:
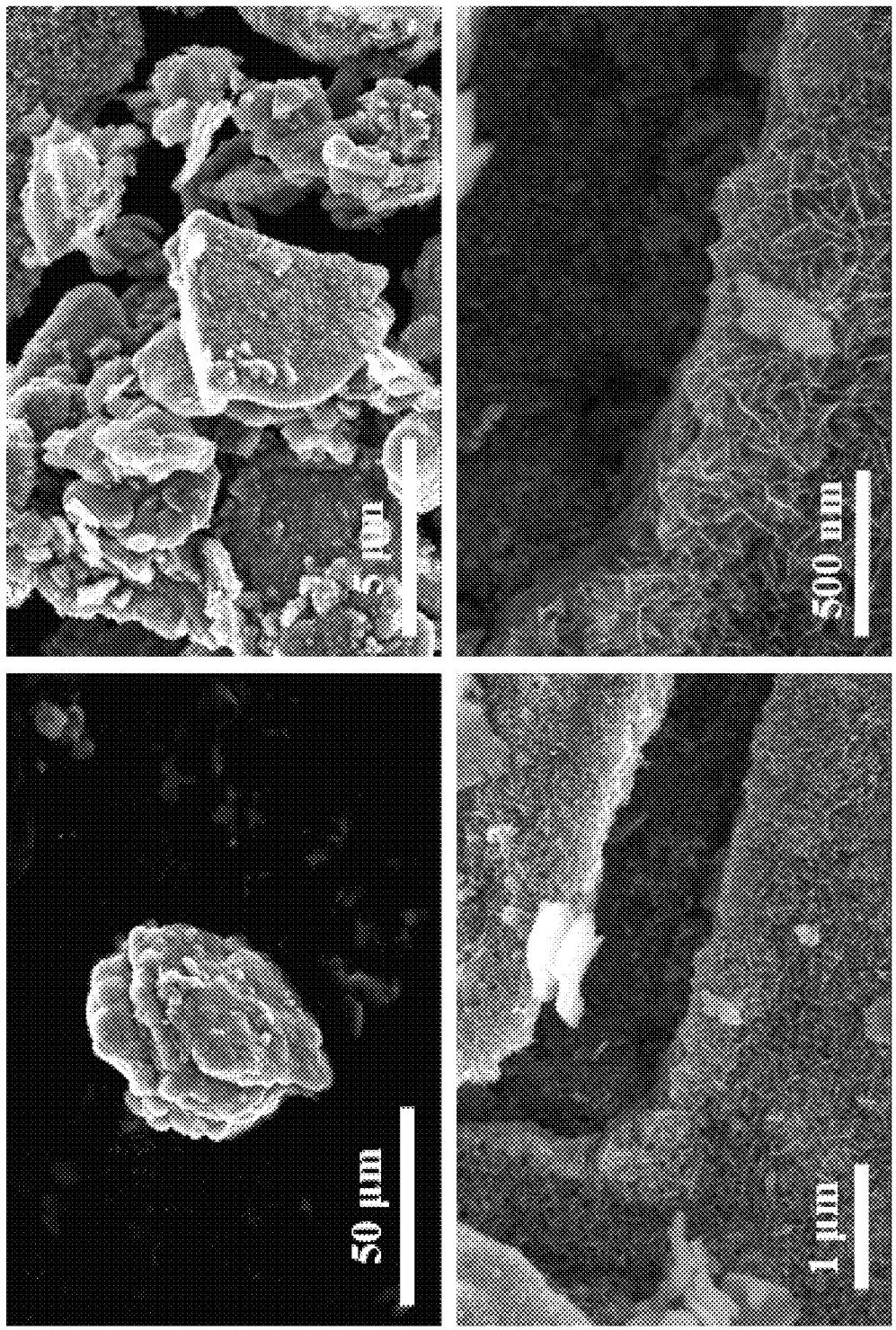
FIG. 7 is an SEM image of a $MnO_2$@TiS heterojunction nanomaterial prepared in example 2.

FIG. 7 is an SEM image of a $MnO_2$@TiS heterojunction nanomaterial prepared in example 2, reflecting the morphologic structure of the composite material: the $MnO_2$@TiS heterojunction nanomaterial is a bulk formed by stacking two-dimensional nano-sheets.

Application Example 2

A wave-absorbing material containing the $MnO_2$@TiS heterojunction nanomaterial of example 2 was prepared by the method of application example 1. In $MnO_2$@TiS/paraffin composite wave-absorbing material samples, doses of TiS were 20 wt %, 40 wt % and 60 wt %. $MnO_2$@TiS/paraffin composite wave-absorbing material samples No. 1, No. 2 and No. 3 were obtained. The wt % was based on the total mass of $MnO_2$@TiS/paraffin composite wave-absorbing material samples.

Figure 8A:
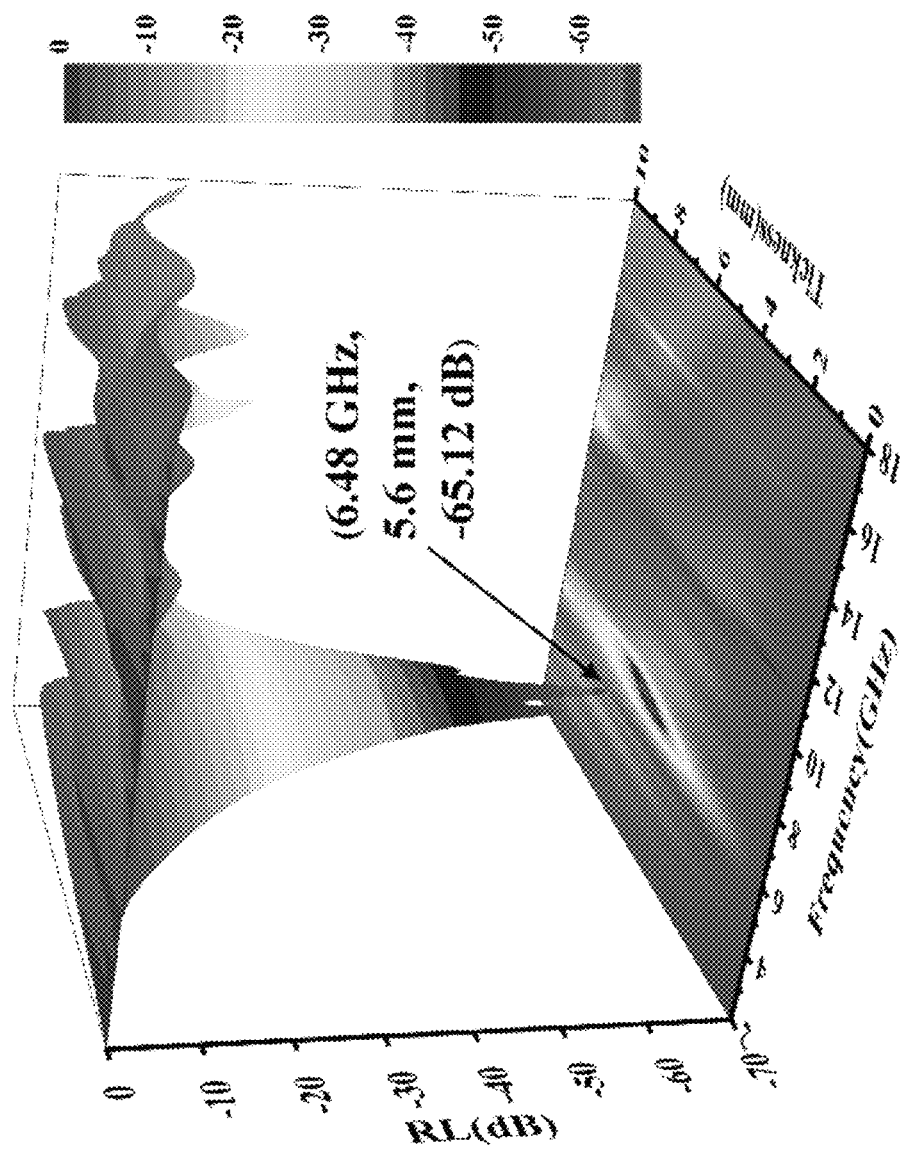
FIG. 8A shows the three-dimensional representation and FIG. 8B shows the contour plot of reflection losses of $MnO_2$@TiS/paraffin composite wave-absorbing material sample No. 1.
Figure 8B:
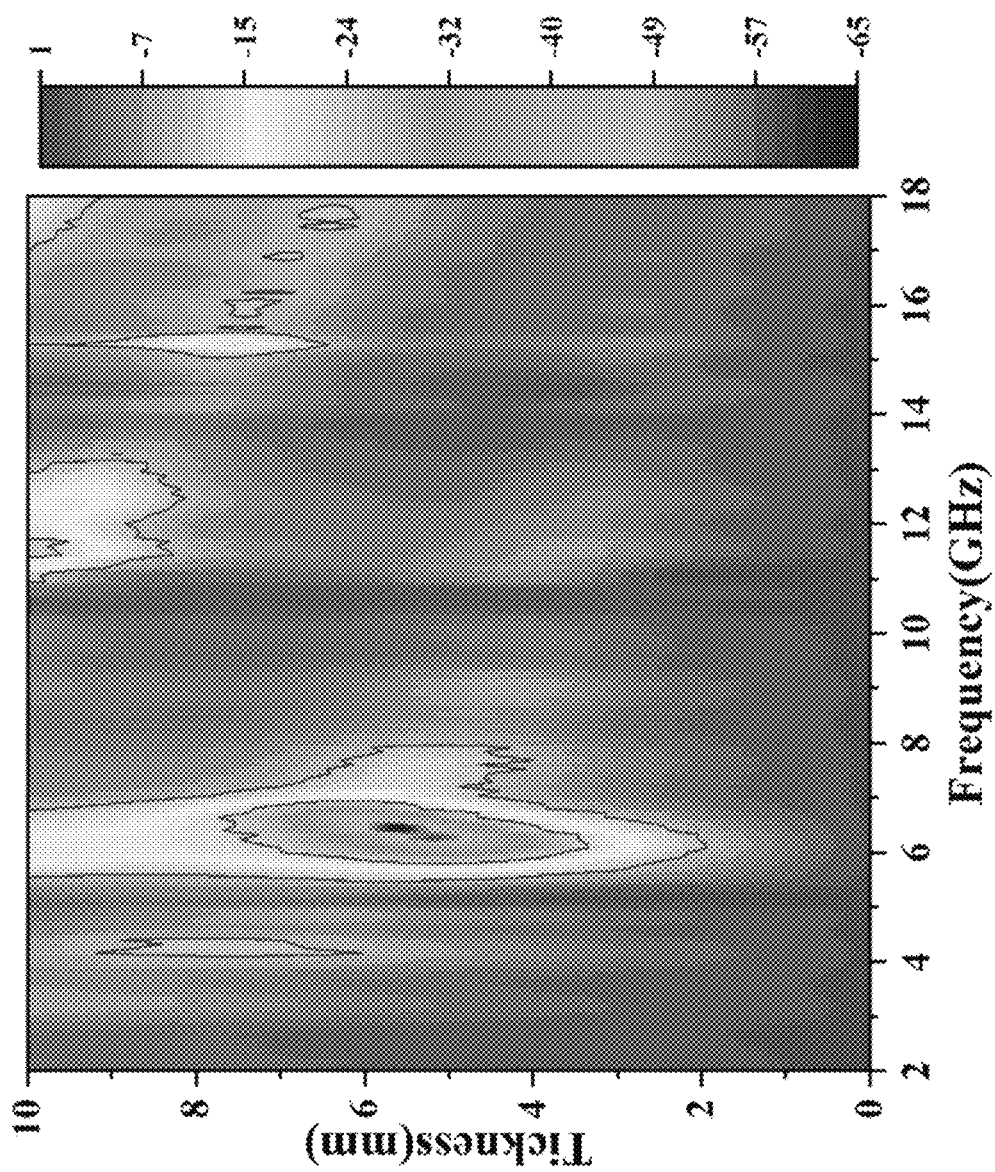
Figure 8C:
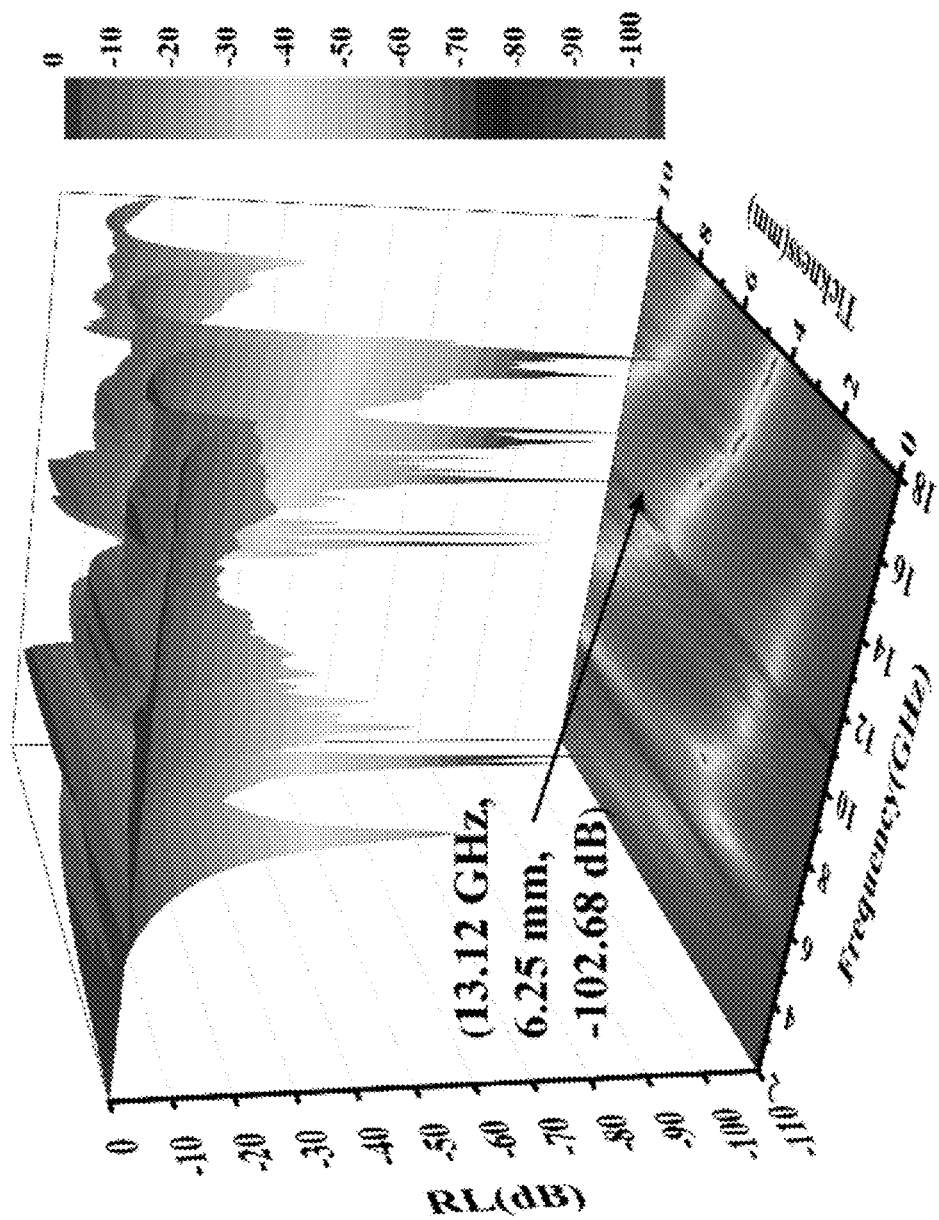
FIG. 8C shows the three-dimensional representation and FIG. 8D shows the contour plot of reflection losses of $MnO_2$@TiS/paraffin composite wave-absorbing material sample No. 2.
Figure 8D:
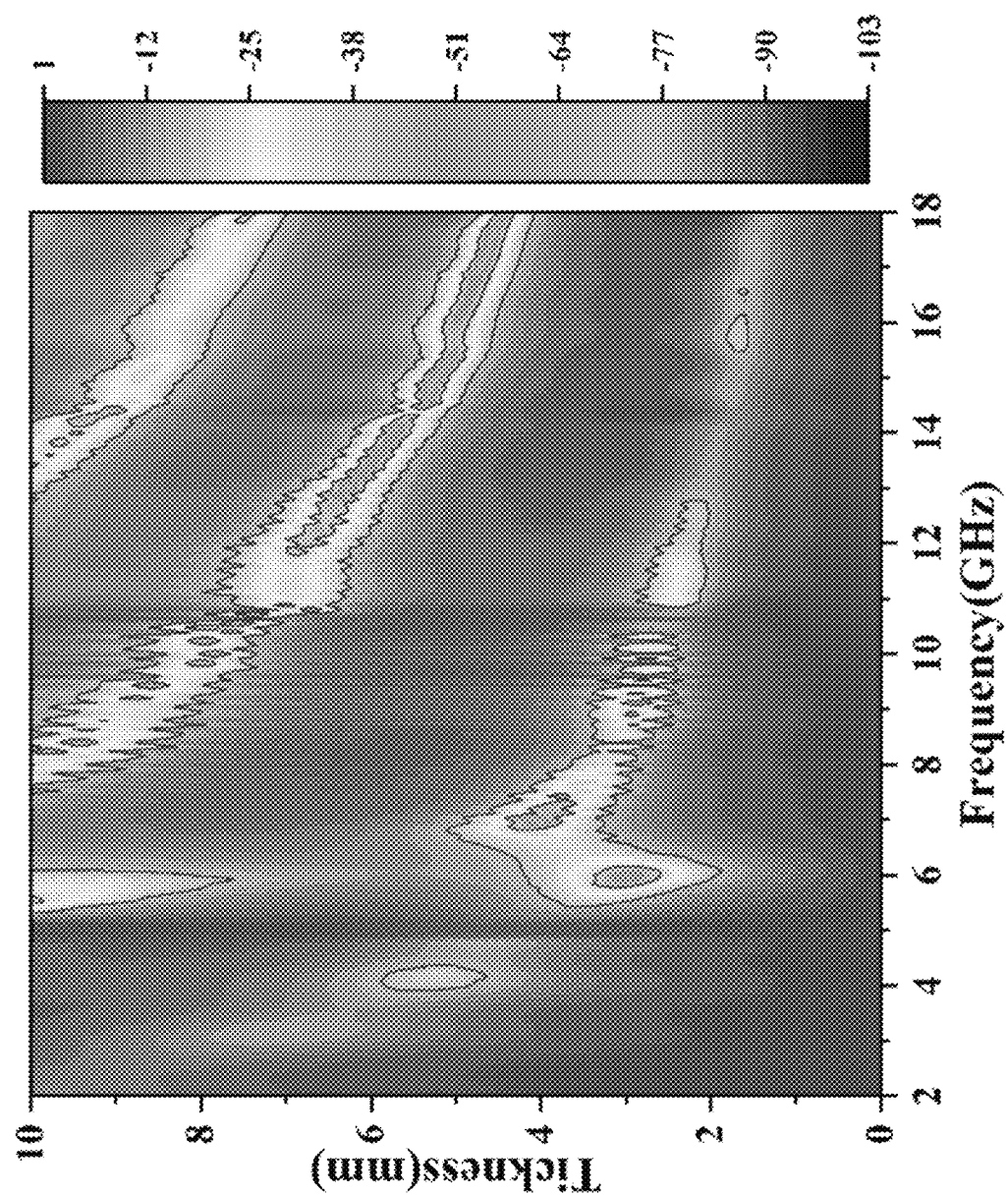
Figure 8E:
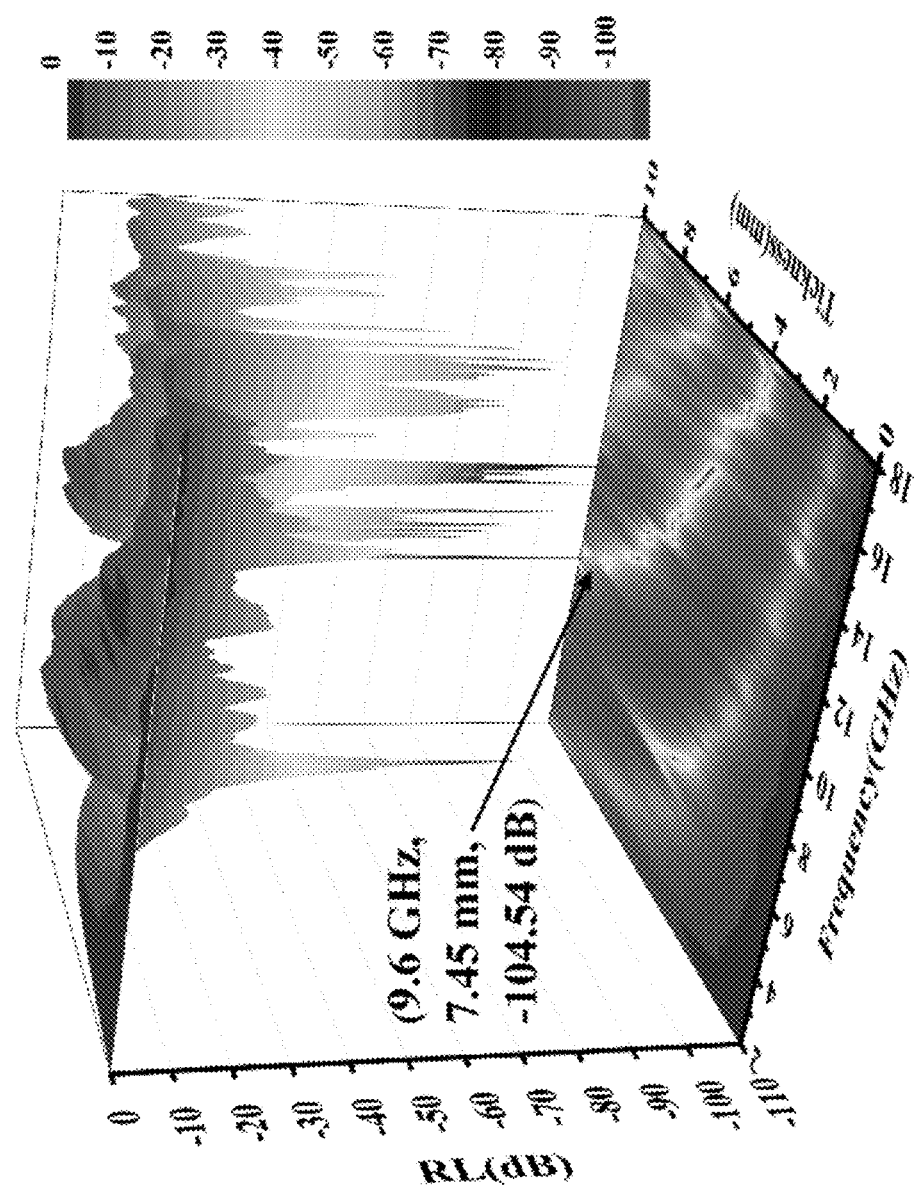
FIG. 8E shows the three-dimensional representation and FIG. 8F shows the contour plot of reflection losses of $MnO_2$@TiS/paraffin composite wave-absorbing material sample No. 3.
Figure 8F:
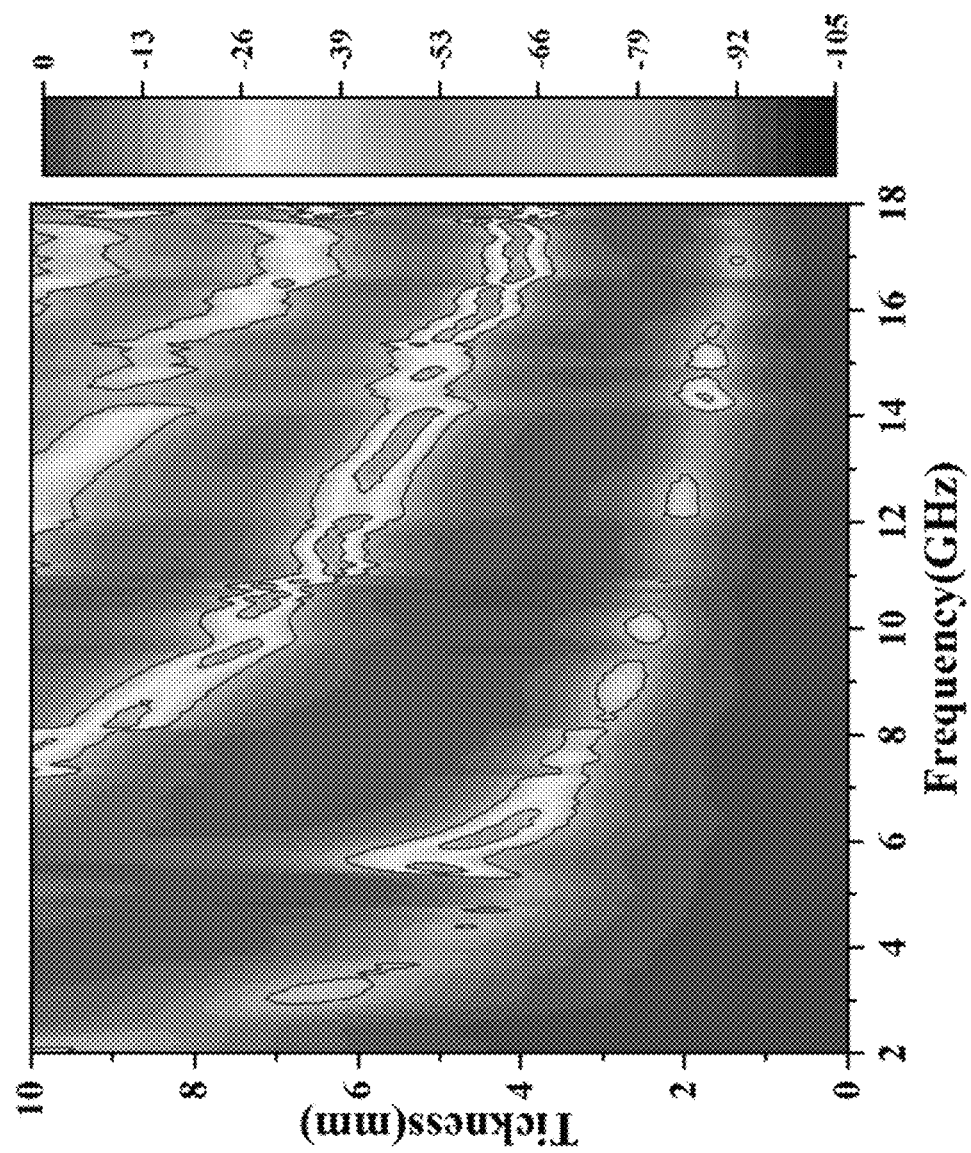

FIGS. 8A-8F reflect the wave absorption performance of the composite material. The wave absorption performance of TiS/paraffin composite wave-absorbing material was tested by the coaxial method. FIGS. 8A, 8C, 8E are three-dimensional representations of reflection losses of $MnO_2$@TiS/paraffin composite wave-absorbing material samples No. 1, No. 2 and No. 3, respectively. FIGS. 8B, 8D, 8F are contour plots of reflection losses of $MnO_2$@TiS/paraffin composite wave-absorbing material samples No. 1, No. 2 and No. 3, respectively. Wave absorption performance data in FIGS. 8A-8F shows that $MnO_2$@TiS/paraffin composite wave-absorbing materials with doses of 20 wt %, 40 wt % and 60 wt % have minimum reflection losses up to −65.12 dB, −102.68 dB and −104.54 dB, and effective absorption bandwidths up to 2.4 GHz, 5.44 GHz and 6.96 GHz, respectively.

Therefore, it can be seen that the composite wave-absorbing material filled with 60 wt % of $MnO_2$@TiS has an effective absorption bandwidth up to 6.96 GHz and a minimum reflection loss up to −104.54 dB, thereby having the optimal comprehensive microwave absorption effect, which is also superior to the microwave absorption effect of the TiS nanomaterial in example 1.

Example 3

The following adjustments were made to synthesis parameters of experimental steps in example 1 to demonstrate the generality of the method: The reaction temperature and reaction time were reduced:

mmol of $TiF_4$, 6.75 mmol of $(COOH)_2 \cdot 2H_2O$ and 20 mmol of $CH_4N_2S$ were added to 60 mL of deionized water in turn, and magnetically stirred for 10 min; the mixed solution was transferred to a polytetrafluoroethylene (PTFE) reactor, heated at 180° C. for 24 h, and naturally cooled to room temperature; after a reaction, the supernatant was poured out, the product at the bottom of the reactor was collected, washed with absolute ethanol and centrifuged at 5,000 rpm for 10 min to obtain a black solid, and this process was repeated three times; the resulting sample was vacuum-dried at 60° C. for 24 h to prepare the TiS nanomaterial.

Figure 9:
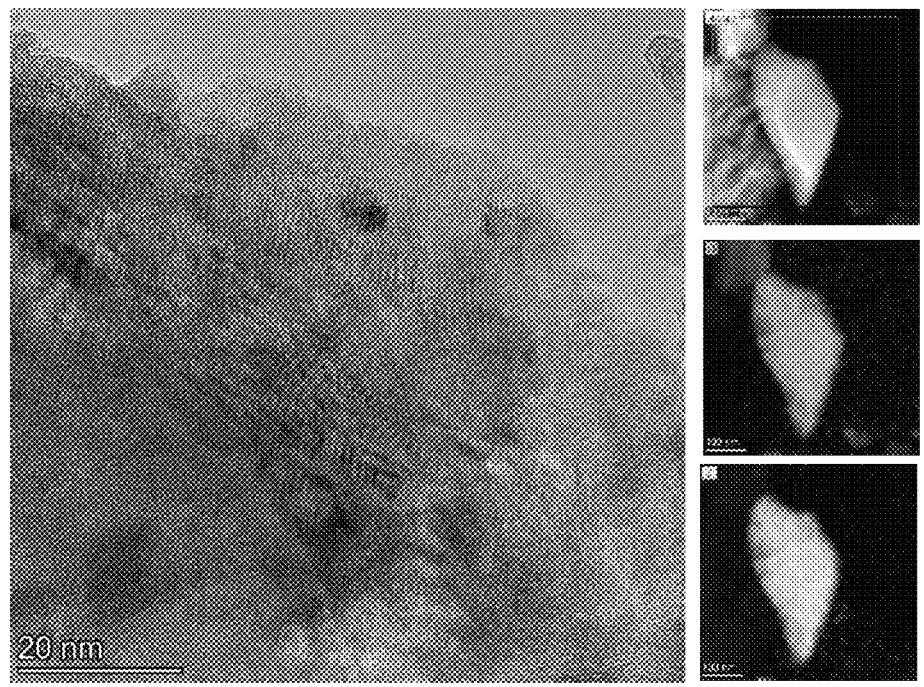
FIG. 9 is a TEM image and an HAADF image of a two-dimensional TiS nanomaterial prepared in example 3.
Figure 10:
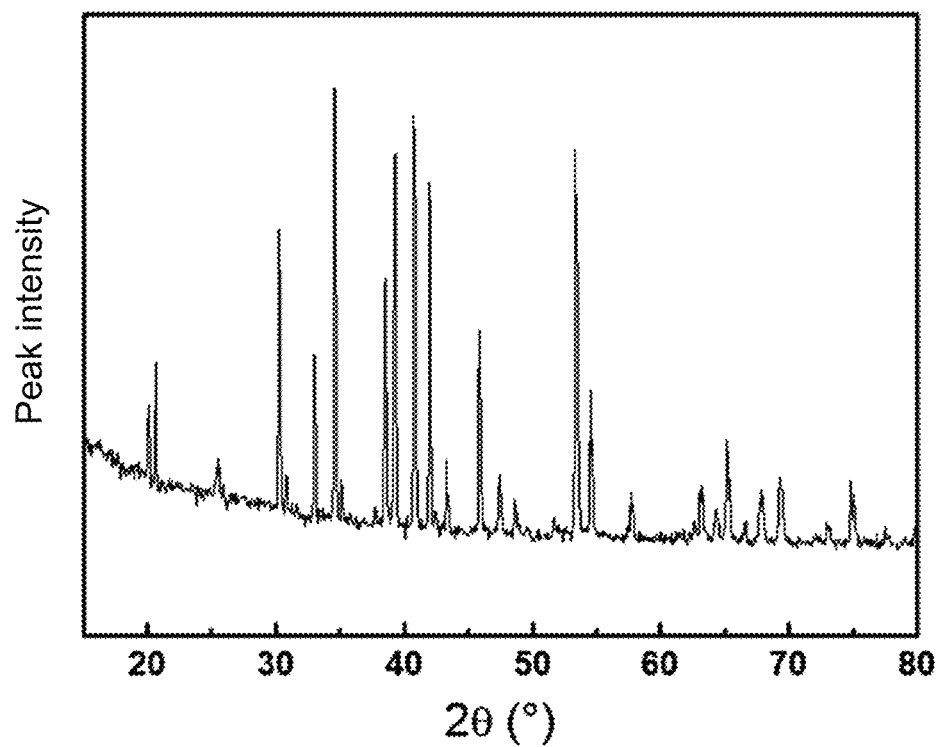
FIG. 10 shows an XRD spectrum of a two-dimensional TiS nanomaterial prepared in example 3.

FIG. 9 is a TEM image and an element distribution diagram of a TiS material. FIG. 10 is an XRD spectrum of a sample. Experimental results demonstrate that a TiS wave-absorbing nanomaterial can also be synthesized at a relatively low temperature, and this method can be used to generate the TiS nanomaterial through a reaction at 180-220° C. for 24-48 h.

Example 4

The following adjustments were made to synthesis parameters of experimental steps in example 2 to demonstrate the generality of the method: The reaction temperature and reaction time were reduced:

100 mg of the TiS powder material prepared in example 1 was added to a 100 ml reactor liner, a 0.05 mol/L potassium permanganate solution was prepared, 70 mL of the 0.05 mol/L potassium permanganate solution was added to a liner of the reactor, and the reactor was tightened, heated in an oven at 120° C. for 12 h, and naturally cooled to room temperature; after a reaction, the supernatant was poured out, the product at the bottom of the reactor was collected, washed with absolute ethanol and centrifuged at 5,000 rpm for 10 min to obtain a black solid, and this process was repeated 3 times; the resulting sample was vacuum-dried at 60° C. for 24 h to prepare a $MnO_2$@TiS heterojunction nanomaterial.

Figure 11:
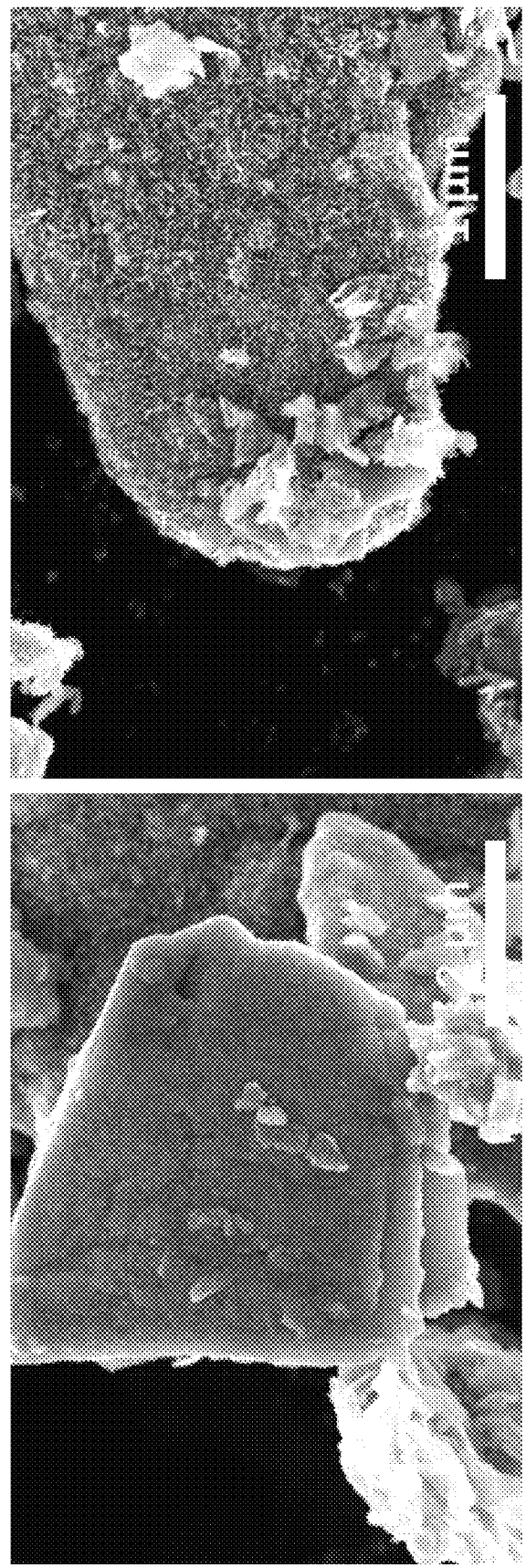
FIG. 11 is an SEM image of a $MnO_2$@TiS heterojunction nanomaterial prepared in example 4.
Figure 12:
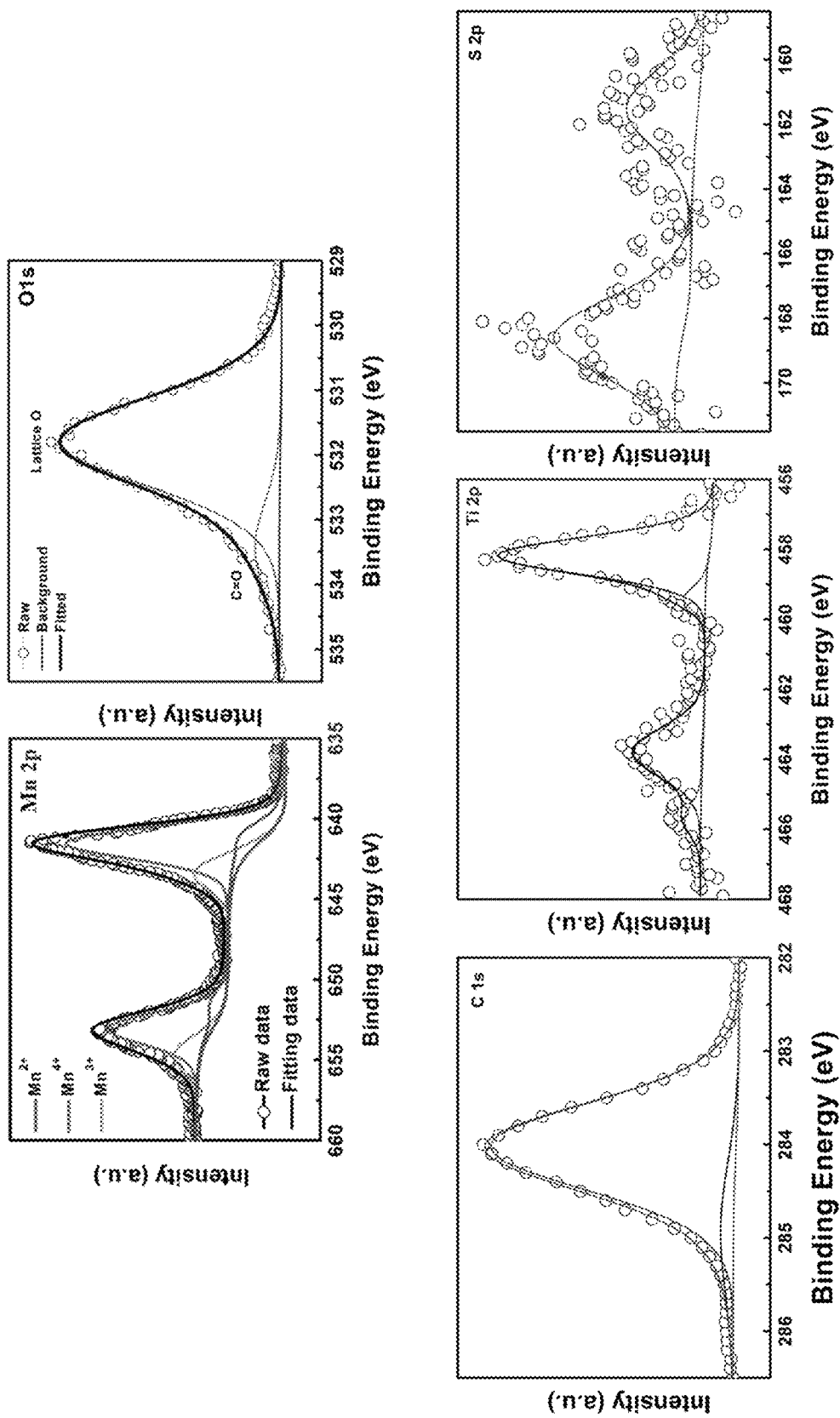
FIG. 12 shows XPS spectra of a $MnO_2$@TiS heterojunction nanomaterial prepared in example 4.

FIG. 11 is an SEM image of a $MnO_2$@TiS material. FIG. 12 shows XPS spectra of a sample. Experimental results demonstrate that a $MnO_2$@TiS wave-absorbing nanomaterial can also be synthesized at a relatively low temperature, and this method can be used to generate the $MnO_2$@TiS nanomaterial through a reaction at 120-160° C. for 12-24 h.

What is claimed is:

1. A wave absorbing material comprising titanium sulfide (TiS) nanomaterial and paraffin, wherein the TiS nanomaterial is in a form of dispersed first micro-particles, wherein the dispersed first micro-particles are bulks of stacked first two-dimensional nano-sheets, wherein each of the first micro-particles has a size of 25-100 microns and the titanium sulfide nanomaterial has a molar ratio of Ti ions to S ions of 1:40 and wherein the titanium sulfide nanomaterial and paraffin form a wave-absorbing composite.

2. The wave absorbing material of claim 1, wherein a thickness of the first two-dimensional nano-sheets is 5-10 nm, and the bulks are irregular in shape.

3. A wave absorbing material comprising $MnO_2$—TiS composite nanomaterial and paraffin, wherein the $MnO_2$—TiS composite nanomaterial is in the form of dispersed second micro-particles, wherein the dispersed second micro-particles are bulks of stacked second two-dimensional nano-sheets, wherein each of the second micro-particles has a size of 25-100 microns and the $MnO_2$—TiS composite nanomaterial has a molar ratio of Ti ions to S ions of 1:40 and wherein the $MnO_2$—TiS composite nanomaterial and paraffin form a wave-absorbing composite.

4. The wave absorbing material of claim 3, wherein a thickness of the second two-dimensional nano-sheets is 10-20 nm, and the bulks are irregular in shape.

5. A method for preparing the wave absorbing material of claim 1, comprising the following steps:

grounding uniformly crushed paraffin and TiS nanomaterial, wherein the TiS nanomaterial is prepared by the following steps:
adding $TiF_4(COOH)_2 \cdot 2H_2O$ and $CH_4N_2S$, wherein molar ratio of Ti ions to S ions is 1:40 and stirring the mixed solution for 5 to 20 minutes;
performing a reaction by heating the mixed solution at 180-220° C. for 24-18 h; and
after the reaction, cooling the mixed solution heated to room temperature, collecting, centrifuging, and washing a reaction product to obtain a black solid, and drying the black solid to obtain the TiS nanomaterial;
heating and melting the grounded paraffin and the TiS nanomaterial;
stirring the melted materials evenly to obtain a mixture; and
pouring the mixture into a mold and pressing the poured mixture into coaxial rings to obtain the wave absorbing material formed by the paraffin and TiS nanomaterial.

6. A method of wave absorption, comprising the step of using the wave absorbing material comprising titanium sulfide (TiS) nanomaterial and paraffin of claim 1 as a wave-absorbing material.

7. A method for preparing the wave absorbing material of claim 3, comprising the following steps:

grounding uniformly crushed paraffin and $MnO_2$—TiS nanomaterial, wherein the $MnO_2$—TiS nanomaterial is prepared by the following steps:
adding a TiS nanomaterial to a reactor, wherein the TiS nanomaterial is in a form of dispersed micro-particles, and the dispersed micro-particles are bulks formed by stacking two-dimensional nano-sheets;
adding a potassium permanganate solution to a liner of the reactor to obtain a reaction mixture, wherein a molar ratio of titanium sulfide and potassium permanganate is 1:20;
tightening the reactor, and performing a reaction by heating the reactor at 120-160° C. for 12-24 h; and
after the reaction, cooling the reactor to room temperature, collecting, washing, and centrifuging a reaction product at a bottom of the reactor to obtain a black solid, and drying the black solid to obtain the $MnO_2$—TiS nanomaterial;
heating and melting the grounded paraffin and the $MnO_2$—TiS nanomaterial;
stirring the melted materials evenly to obtain a mixture; and
pouring the mixture into a mold and pressing the poured mixture into coaxial rings to
obtain the wave absorbing material formed by the paraffin and $MnO_2$—TiS nanomaterial.

8. A method of wave absorption, comprising the step of using the wave absorbing material $MnO_2$—TiS composite nanomaterial and paraffin of claim 3 as a wave-absorbing material.

* * * * *